United States Patent
Weisenbach

(10) Patent No.: US 10,418,079 B1
(45) Date of Patent: Sep. 17, 2019

(54) REGISTER FILE BIT CELLS WITH INTEGRATED MULTIPLEXER

(71) Applicant: Oracle International Corporation, Redwood Shores, CA (US)

(72) Inventor: Robert Weisenbach, Needham, MA (US)

(73) Assignee: Oracle International Corporation, Redwood Shores, CA (US)

(*) Notice: Subject to any disclaimer, the term of this patent is extended or adjusted under 35 U.S.C. 154(b) by 0 days.

(21) Appl. No.: 15/935,273

(22) Filed: Mar. 26, 2018

(51) Int. Cl.
G11C 7/00 (2006.01)
G11C 7/12 (2006.01)
G11C 7/18 (2006.01)
H03K 3/356 (2006.01)

(52) U.S. Cl.
CPC .............. G11C 7/12 (2013.01); G11C 7/18 (2013.01); H03K 3/356113 (2013.01)

(58) Field of Classification Search
CPC .......... G11C 7/12; G11C 7/18; H03K 3/35611
USPC ....................... 365/189.02, 189.11
See application file for complete search history.

(56) References Cited

U.S. PATENT DOCUMENTS

| | | | | |
|---|---|---|---|---|
| 5,056,061 A | * | 10/1991 | Akylas | G06K 1/128 257/E27.009 |
| 5,530,824 A | * | 6/1996 | Peng | G06F 12/1027 365/189.02 |
| 8,848,413 B2 | | 9/2014 | Donkoh | |
| 9,396,790 B1 | | 7/2016 | Chhabra et al. | |
| 9,922,688 B2 | | 3/2018 | Weier | |
| 2008/0168231 A1 | * | 7/2008 | Ramaraju | G06F 12/0895 711/131 |
| 2012/0188838 A1 | * | 7/2012 | Cheng | G11C 7/12 365/230.06 |

* cited by examiner

*Primary Examiner* — Vu A Le
(74) *Attorney, Agent, or Firm* — Meyertons, Hood, Kivlin, Kowert & Goetzel, P.C.

(57) ABSTRACT

A bit cell structure with an integrated multiplexer is disclosed. In one embodiment, a circuit includes a plurality of bit cells, e.g., first and second bit cells. The circuit further includes a multiplexer having an input coupled to a first data line associated with the first bit cell and a second input coupled to a second data line associated with a second bit cell. The circuit further includes a PMOS transistor having a gate terminal coupled to an output of the multiplexer, and further coupled between a local read bit line and a voltage source. The PMOS transistor is configured to pull the local read bit line to a logic high value responsive to a selected one of the plurality of bit cells conveying a logic low to its respectively coupled input of the multiplexer.

20 Claims, 4 Drawing Sheets

REGISTER FILE BIT CELLS WITH INTEGRATED MULTIPLEXER

BACKGROUND

Technical Field

This disclosure is directed to electronic circuits, and more particularly, circuits used in implementing memory structures such as register files.

Description of the Related Art

Computer systems and the various integrated circuits implemented therein utilize a wide variety of memory types, which may be arranged in a memory hierarchy. At the top of a memory hierarchy may be registers implemented in a register file. In a processor, register files may be that memory that is closest to the execution units. The memory implemented using registers may store operands to be used in various operations of the computer system, as well as providing temporary storage of results. Other memories implemented on a processor may include various levels of cache memory, which may store data and/or instructions that are frequently used or have been more recently used.

Register files and cache memories may be implemented using various circuit structures. A common circuit structure used in implementing, e.g., a register file, may be a bit cell, which includes two cross-coupled inverters that store a data value and a complement thereof on true and complementary nodes, respectively. Data may be conveyed to a bit cell via write bit lines, and written to responsive to activation of pass transistors coupled between the bit cell and the write bit lines. A read operation may be conducted by conveying data from the bit cell via a read bit line.

SUMMARY

A bit cell structure with an integrated multiplexer is disclosed. In one embodiment, a circuit includes a plurality of bit cells, e.g., first and second bit cells. The circuit further includes a multiplexer having an input coupled to receive a data value from a first bit line associated with the first bit cell and a second input coupled to receive a data value from a second bit line associated with a second bit cell. The circuit further includes a PMOS transistor having a gate terminal coupled to an output of the multiplexer, and further coupled between a local read bit line and a voltage source. The PMOS transistor is configured to pull the local read bit line to a logic high value responsive to a selected one of the plurality of bit cells conveying a logic low to its respectively coupled input of the multiplexer.

In one embodiment, the bit cell structure includes first and second bit cells having first and second data lines, respectively, coupled as inputs to the multiplexer. A first read word line is coupled to a gate terminal of a first pass transistor, and acts as selection signal to select a data value received from the first read bit line. A second read word line is coupled to a gate terminal of a second pass transistors, and acts as a selection signal to select a second data value received from the second read bit line. During a read cycle, one of the select lines may be activated to select the read bit line of its corresponding cell. If neither of the select signals are active, a pull-up stack coupled between the multiplexer output and a voltage supply node is activated to pull the multiplexer output node to a logic high value.

BRIEF DESCRIPTION OF THE DRAWINGS

The following detailed description makes reference to the accompanying drawings, which are now briefly described.

Figure 1:
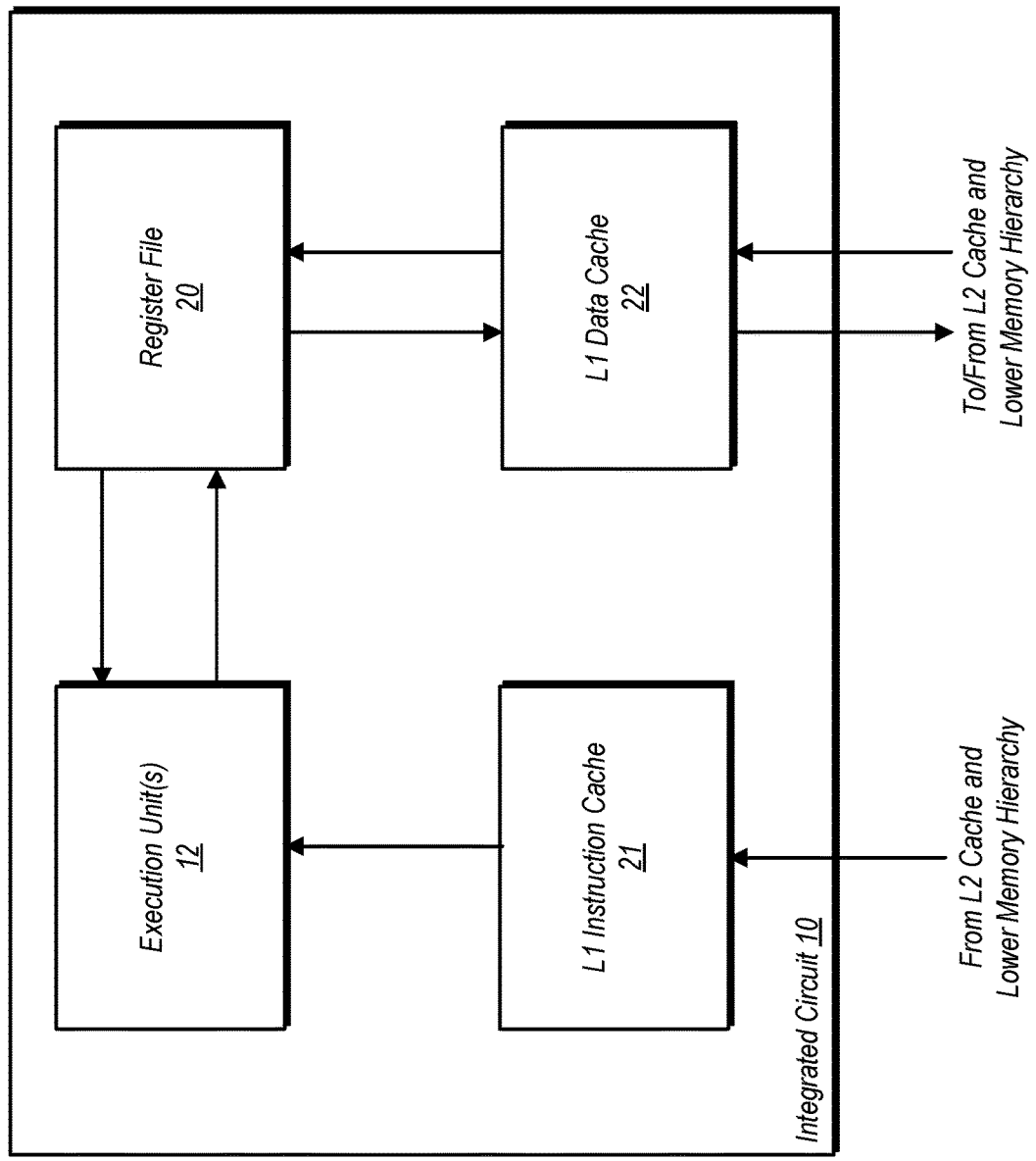
FIG. 1 is a block diagram of one embodiment of an integrated circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the terms "first," "second," etc. are used as labels for nouns that they precede, and do not imply any type of ordering (e.g., spatial, temporal, logical, etc.), unless stated otherwise. For example, in a portion of a register file having eight bit cells, the terms "first bit cell" and "second bit cell" can be used to refer to any two of the eight bit cells, and not, for example, just logical bit cells 0 and 1.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

Turning now to FIG. 1, a block diagram of one embodiment of an integrated circuit (IC) is shown. In the illustrated embodiment, IC 10 is a processor, and includes execution unit(s) 12, which may include one or more circuits for executing instructions of a processor instruction set. In some embodiments, multiple execution units for different types of data (e.g., floating point, integer, etc.) may be present.

Execution unit(s) 12 in the illustrated embodiment are coupled to register file 20 and L1 instruction cache 21.

Instructions for execution may be forwarded from L1 instruction cache 21 to execution unit(s) 12 (an instruction fetch unit may be present, but is not shown for the sake of simplicity). Meanwhile, register file 20 may provide storage for operands to be used with instructions to be executed. Register file 20 may further store results of instructions that have been executed. L1 data cache 22 may provide operands for instructions to be executed to register file 20. Additionally, results from executed instructions may be written back to L1 data cache 22, and eventually to other locations lower in the memory hierarchy. Both L1 instruction cache 21 and L1 data cache 22 may be coupled to an L2 cache (not shown), which may or may not be implemented on IC 10. Additionally, IC 10 may also be coupled other locations in a memory hierarchy, including the L2 cache, as well as other caches (e.g., an L3 cache), a main memory, and bulk storage.

Register file 20 may be implemented using various embodiments of the circuit structures discussed below. In some embodiments, various caches such as L1 instruction cache 21 and L1 data cache 22 may also be implemented with similar circuit structures. Generally speaking, the circuit structures discussed below may be used to implement a wide variety of on-chip memories, with those shown here being possible examples.

Figure 2:
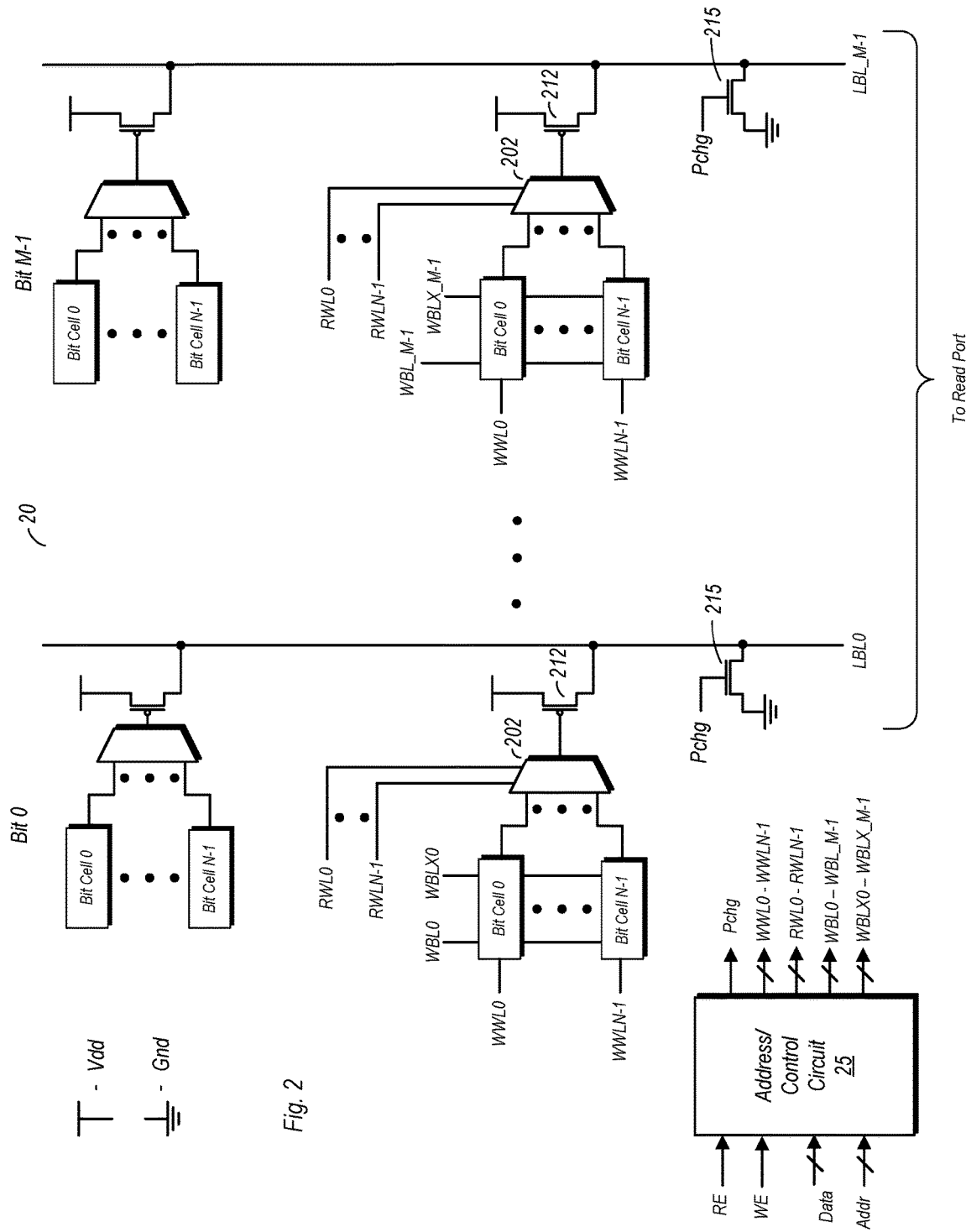
FIG. 2 is a diagram illustrating the arrangement one embodiment of a register file.

FIG. 2 is a diagram illustrating the arrangement one embodiment of a register file. In the embodiment shown, register file includes a number of bit positions, namely M bit positions where M is an integer value. Each bit cell may include two or more bit cells coupled to a corresponding multiplexer 202. The number of bit cells coupled to a particular multiplexer 202 may vary from one embodiment to the next, and may be limited only by practical implementational details (e.g., available area, etc.). Generally speaking, the embodiment shown may include up to N bit cells coupled to a given instance of multiplexer 202, with N being an integer value. As further shown, multiple instances of a multiplexer may be coupled to each local bit line by a corresponding PMOS transistor.

Each multiplexer 202 in the illustrated embodiment is coupled to receive a number of different selection signals, one for each bit cell coupled thereto (for the sake of simplicity, only the bottom two multiplexers are shown as receiving selection signals). Each of the selection signals is a read word line, and is coupled to multiplexers 202 in each of the bit positions. For example, read bit line RWL0 is coupled to each multiplexer 202 from Bit 0 to Bit M−1. During a read operation, a select signal is asserted on one read word line, while select signals on each of the remaining word lines remain de-asserted. During a write operation, or when no operation is occurring, all select signals remain de-asserted.

The data inputs to each multiplexer 202 are data values of the correspondingly coupled bit cells. Within a given bit position, a selected bit cell may convey a logic value (in this example, a complement to the true value stored in the cell) through its corresponding multiplexer 202 to the gate terminal of a correspondingly coupled PMOS transistor 212. If the conveyed value is a logic low, the PMOS transistor 212 is activated, causing the correspondingly coupled local read bit line to be pulled high (toward Vdd). If the conveyed value is a logic low, the PMOS transistor 212 remains inactive, and the local read bit line remains at a precharged value.

Each of the local read bit lines in the embodiment shown is configured to convey correspondingly logic values to a read port. Prior to any read operation, each local read bit line may be precharged to a logic low level by activation of a corresponding precharge transistor 215. Each precharge transistor includes a gate terminal coupled to receive a precharge signal (Pchg) from Address/Control circuit 25.

Each set of bit cells in a given bit position may be coupled to a common pair of write bit lines, one for conveying the true logic value and one for conveying the complementary logic value. For example, in the Bit 0 position, write bit lines WBL0 and WBLX0 convey the true and complementary logic values to a select one of the bit cells. Each of the bit cells is also coupled to a corresponding write word line, which is common to all bit cells in a common word position across all bit cells. For example, write word line WWL0 is conveyed to Bit Cell 0 in each of the bit positions from Bit 0 to Bit M−1. During a write operation, one of the write word lines is asserted, and logic values conveyed on the true and complementary write bit lines in each bit position are conveyed and written into respectively selected bit cells in each bit position.

Address/control circuit 25 in the embodiment shown is coupled to both receive and convey various control signals, as well as address signals. In the embodiment shown, a read enable signal, RE, may be asserted to conduct a read operation. A write enable signal, WE, may be asserted to conduct a write operation. Address signals (Addr) may be received from an external source (such as an execution unit) to provide an address to which data is to be written to or read from. During read operations, these address signals may be converted decoded to assert corresponding read word line signals (RWL0-RWLN−1). During write operations, the address signals may be decoded into corresponding write word line signals (WWL0-WWLN−1). Data received by address/control circuit 25 may be routed to the appropriate true and complementary write bit lines (e.g., WBL0 and WBLX0 to the selected cell in the Bit 0 position).

It is noted that the organization of register file 20 as shown in FIG. 2 is exemplary, and that embodiments implementing other arrangements are possible and contemplated. Generally speaking, any arrangement of bit cells in which multiple bit cells feed a multiplexer that is coupled to a local read bit line in the manner shown may fall within the scope of this disclosure.

Figure 3:
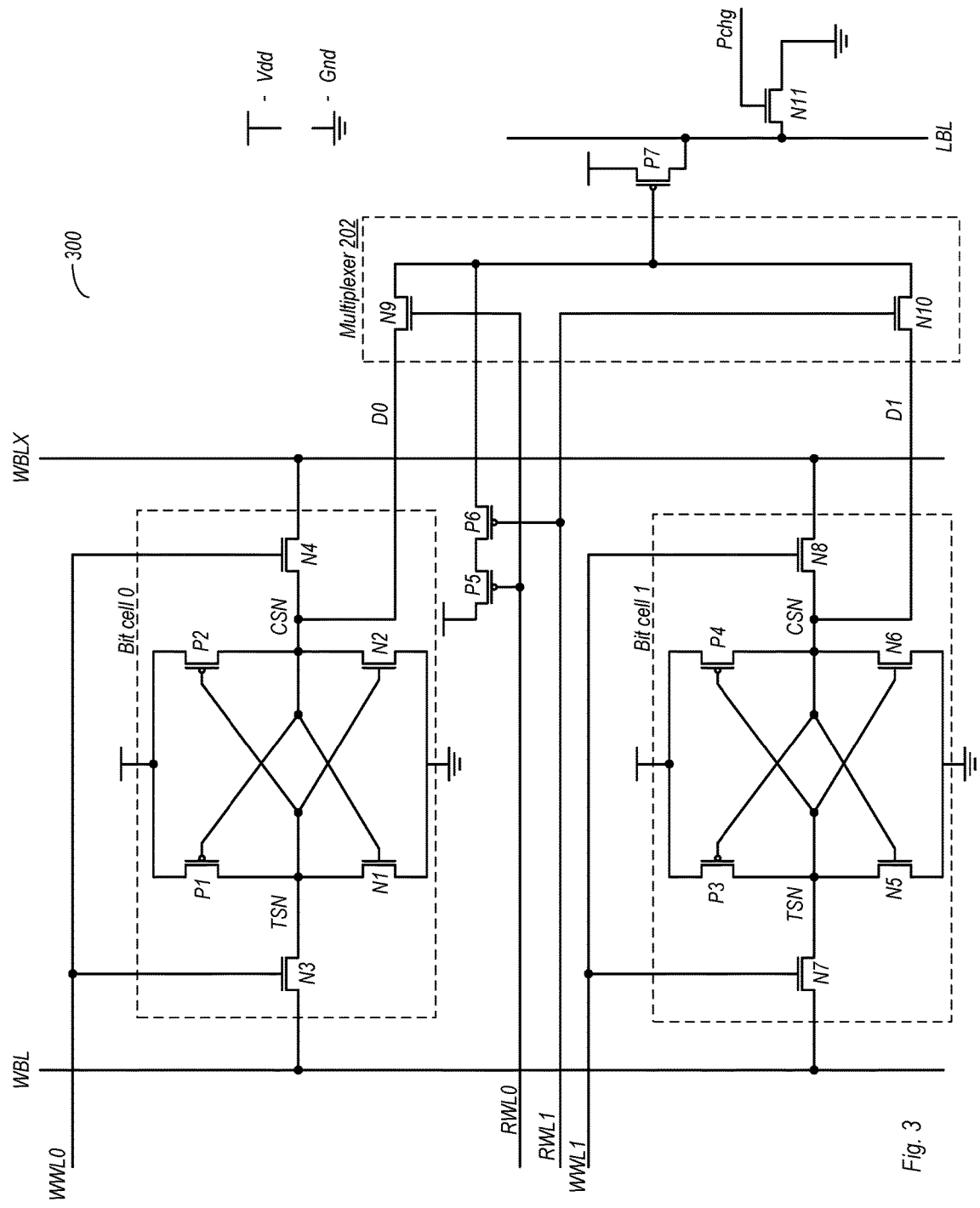
FIG. 3 is a schematic diagram of one embodiment of a bit cell structure implemented in a register file.

FIG. 3 is a schematic diagram of one embodiment of a bit cell structure implemented in a register file. In the embodiment shown, circuit 300 is limited to two bit cells. It is noted however, per the discussion above, the arrangement shown in FIG. 3 may be extended to a number of bit cells greater than two, and the scope of this disclosure is intended to cover such embodiments.

In the embodiment shown, each bit cells implements a cross-coupled inverter. Bit cell 0 implements a first inverter with transistors P1 and N1, and a second inverter with transistors P2 and N2. The first inverter outputs to a true storage node, TSN, while the second inverter outputs to a complementary storage node, CSN. Bit cell 1 is arranged in largely the same manner.

Multiplexer 202 in the embodiment shown is implemented with pass transistors N9 and N10, each of which are coupled between a data line associated with a corresponding bit cell, and the multiplexer output node that feeds the gate terminal of P7. The arrangement of multiplexer 202 in the embodiment shown is essentially that of a one-hot multiplexer, in which only one select signal is asserted at a given time. It is noted that the data lines associated with each bit cell are effectively the same node as that cell's complementary storage node (e.g., D0 is coupled to, and effectively same node as CSN of Bit cell 0). A read of Bit cell 0 may be accomplished by asserting a select signal on the corresponding read word line, RWL0. This causes activation of transistor N9, which allows the value stored on the complementary storage node of Bit cell 0 to be conveyed through N9 to the gate of P7. Similarly, a read of Bit cell 1 may be accomplished by assertion of the read word line RWL1 and resulting activation of N10.

It is important to note that P7 is a single device coupled between the local bit line and VDD. Thus, no stack of devices (i.e. two or more in series) between the global bit line and a voltage node is used in this embodiment. By utilizing a single, unstacked device in P7, flexibility is gained for a tradeoff between speed, leakage, and area. For example, in an embodiment utilizing an NMOS-based read port driving a local bit line, two NMOS devices of width X would be stacked. Additionally, a number of these types of read ports could be stacked on the local bit line. Loading on the bit line in such embodiments is dominated by device width, as is the leakage. Transistor P7 in this embodiment has a width of Y driving the local bit line. If Y=X and there are, e.g., 16 word lines to the local bit line, then the circuit shown in FIG. 2 has half the load of the alternate embodiment having two NMOS devices with width X, while having twice the effective width driving the bit line, and half the leakage current (16*X vs. 8*Y for the load, and X/2 vs. Y for amount of drive). If the load and leakage are kept approximately the same, the circuit of FIG. 2 could be implement 32 word lines per bit line, thereby reducing the number of sensing elements. If the circuit of FIG. 2 implements only 16 lines, but with Y=X/2, the effective leakage current may be further reduced.

It is also important to note that the multiplexer circuit of FIG. 2 may act as a gain element. A slow slew may be corrected for by the input to P7. This may result in less delta in a read delay across the bits attached to the read word line. In the NMOS embodiment discussed above, an NMOS transistor receiving the slowest slew at the end of the word line would further reduce the speed of the read.

The output provided to the gate terminal of PMOS device P7 during a read operation may cause the value stored on the true storage node of the selected bit cell to be conveyed on the local bit line, LBL. Consider the example where Bit cell 0 is selected during a read operation. If the value stored on the true storage node TSN is a logic 1, the value stored on the complementary storage node CSN is a logic 0. The logic 0 conveyed to the gate terminal of P7 during a read operation causes activation of this device. As a result, the local bit line is pulled high, or to a logic 1, which is the same value stored on the true storage node TSN of the selected bit cell. Otherwise, if a logic 0 is stored on the true storage node, the logic 1 conveyed to the gate terminal of P7 from the complementary storage node does not result in activation of this device. Accordingly, the local bit line will remain low, or logic 0, to which it is precharged prior to the read operation (by activation of transistor N11, responsive to assertion of the precharge signal Pchg).

Circuit 300 in the embodiment shown also includes a PMOS pull-up stack coupled between the output node of multiplexer 202 and Vdd. The PMOS pull-up stack includes transistors P5 (the gate terminal of which is coupled to RWL0), and P6 (the gate terminal of which is coupled to RWL1) coupled in series between the output node of multiplexer 202 and Vdd. When both select signals are de-asserted (e.g., RWL0 and RWL1 are low in this embodiment), both P5 and P6 are activated to provide a pull-up path between the output node of multiplexer 202 and Vdd. Thus, the output node of multiplexer 202 is pulled high, and P7 is held inactive. This operation may occur during a precharge phase, during write operations, and when no other operations are being performed on any of the bit cells coupled to multiplexer 202.

Write operations to the bit cells may be conducted by conveying data via the illustrated write bit lines WBL and WBLX, which convey true and complementary logic values, respectively. Pass transistors are coupled between these write bit lines and a correspondingly coupled bit cell. For example, transistor N3, when active, couples WBL to the true storage node TSN of Bit cell 0, while transistor N4, when active, and couples WBLX to the complementary storage node CSN of Bit cell 0. These pass transistors may be activated by assertion of a write signal on a correspondingly coupled write word line. More particularly, transistors N3 and N4 may be activated responsive to a logic high on WWL0, while transistors N7 and N8 (of Bit cell 1) may be activated responsive to a logic high on WWL1.

Generally speaking, the bit cells shown in the arrangement of FIG. 3 may be considered to be 8T bit cells, The main portion of each cell includes six transistors (the transistors of the cross-coupled inverters and the pass transistors coupled between the write bit lines and the inverters). A seventh transistor is the pass transistor of the multiplexer for each bit cell (N9 for Bit cell 0, N10 for Bit cell 1). The eighth transistor is the commonly shared PMOS device, P7. Arranging the bit cells in this manner may allow for smaller register files. Furthermore, since the PMOS device at the read port is shared among a number of bit cells, it may be implemented as a larger device that is less prone to leakage and switches faster.

Figure 4:
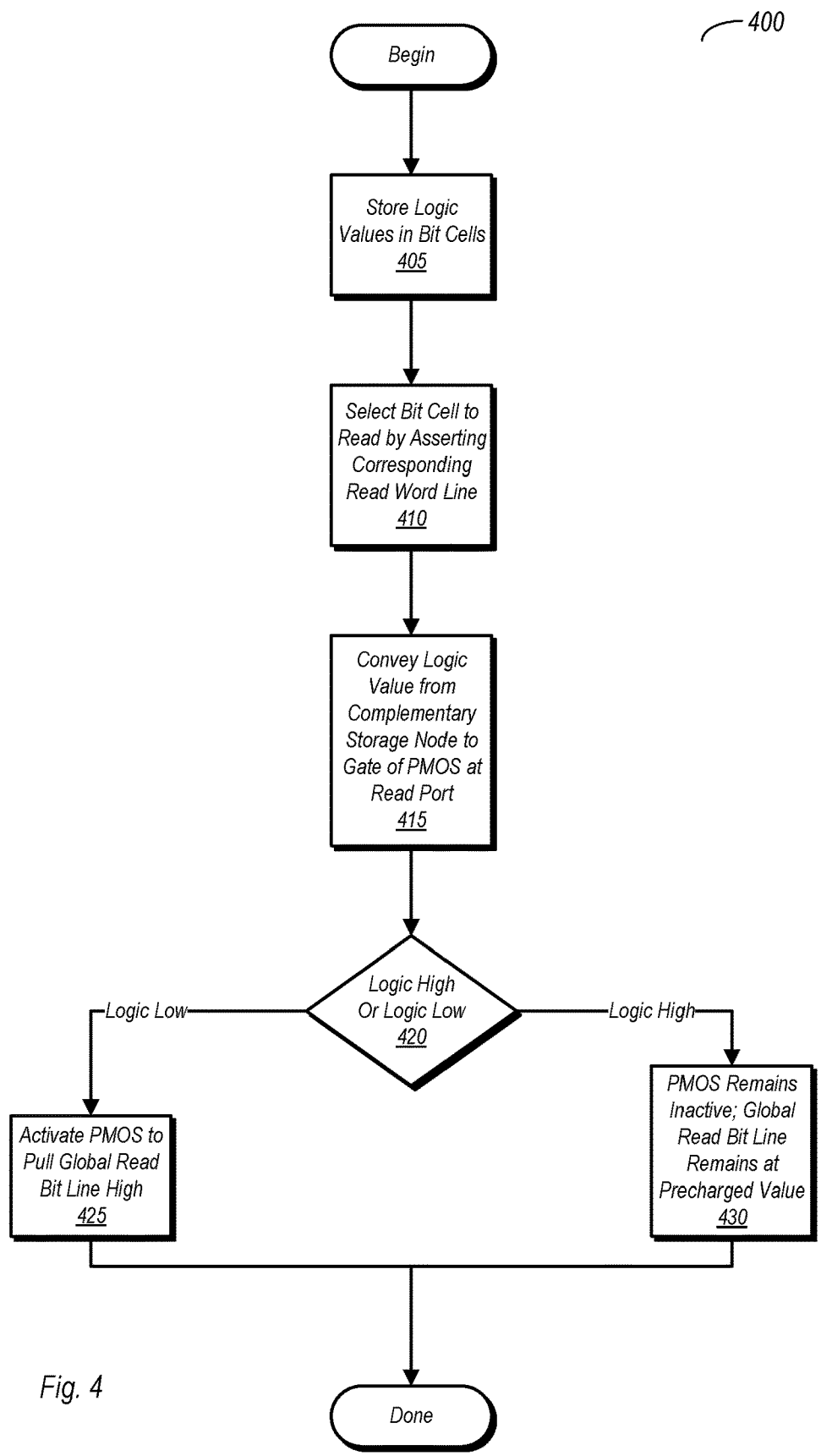
FIG. 4 is a flow diagram illustrating one embodiment of a method for reading from a bit cell structure.

FIG. 4 is a flow diagram illustrating one embodiment of a method for reading from a bit cell structure. Method 400 may be performed with any of the various hardware/circuit embodiments discussed above. Additionally, some hardware/circuit embodiments not explicitly discussed herein are contemplated as being able to carry out method 400. Such embodiments may also fall within the scope of this disclosure. Furthermore, method 400 is described in terms of reading from a single bit cell during a read cycle, although it is to be understood that multiple bit cells by be read concurrently.

Method 400 begins with the storing of logic values in bit cells (block 405). The storing of these values may be initiated by writing to the bit cells as described above. To initiate a read operation, a corresponding bit cell may be selected by assertion of a select signal on a corresponding read word line (block 410). Upon assertion of the select signal, a pass transistor is activated in a multiplexer, allowing a logic value from a complementary storage node of the selected bit cell to a gate terminal of a PMOS transistor at the read port (block 415).

In the case where the logic value conveyed from the complementary storage node is a logic low, (block 420, Logic Low), the PMOS transistor is activated to cause the local bit line to be pulled high (block 425). Otherwise, if the logic value conveyed from the complementary storage node is a logic high (block 420, logic high), then the PMOS transistor at the read port remains inactive and the local bit line remains at a precharged logic low value (block 430).

Numerous variations and modifications will become apparent to those skilled in the art once the above disclosure is fully appreciated. It is intended that the following claims be interpreted to embrace all such variations and modifications.

What is claimed is:

1. A circuit comprising:
   a first bit cell and a second bit cell;

a multiplexer having a first input coupled to a first data line associated with the first bit cell, and a second input coupled to a second data line associated with the second bit cell; and a first PMOS (p-channel metal oxide semiconductor) transistor having a gate terminal coupled to an output of the multiplexer, and further coupled between a local read bit line and a voltage source, wherein the first PMOS transistor is configured to pull the local read bit line to a logic high value responsive to a selected one of the first and second bit cells conveying a logic low value to its respectively coupled input of the multiplexer.

2. The circuit as recited in claim 1, wherein the multiplexer includes:

a first NMOS (n-channel metal oxide semiconductor) transistor coupled between the first data line and the output of the multiplexer, wherein a gate terminal of the first NMOS transistor is coupled to receive a first selection signal via a first read word line; and a second NMOS transistor coupled between the second data line and the output of the multiplexer, wherein a gate terminal of the of the second NMOS transistor is coupled to receive a second selection signal via a second read word line.

3. The circuit as recited in claim 1, further comprising a pull-up stack comprising second and third PMOS transistors coupled in series between the output of the multiplexer and the voltage source, wherein a gate terminal of the second PMOS transistor is coupled to a first read word line associated with the first bit cell, and wherein a gate terminal of the third PMOS transistor is coupled to a second read word line associated with the second bit cell.

4. The circuit as recited in claim 3, wherein each transistor of the pull-up stack is configured to be activated to pull the output of the multiplexer high responsive to each selection signal provided to the multiplexer being in a de-asserted state at the same time.

5. The circuit as recited in claim 1, further comprising a precharge transistor coupled to the local read bit line, wherein, during a precharge cycle, the precharge transistor is configured to pull the local read bit line to a logic low value.

6. The circuit as recited in claim 1, wherein each of the first and second bit cells include corresponding first and second cross-coupled inverters.

7. The circuit as recited in claim 1, wherein each of the first and second bit cells include a corresponding storage node and a corresponding complementary storage node, wherein the first data line is coupled to a complementary storage node of the first bit cell and the second data line is coupled to a complementary storage node of the second bit cell.

8. The circuit as recited in claim 7, wherein each of the first and second bit cells further comprises a respective first pass transistor coupled between its corresponding storage node and a first write bit line and a respective second pass transistor coupled between its corresponding complementary storage node and a second write bit line.

9. The circuit as recited in claim 8, wherein each of the first and second pass transistors of each of the first and second bit cells include respective gate terminals coupled to a corresponding write word line, wherein the first and second pass transistors of each of the first and second bit cells is configured to be activated responsive to assertion of a write signal on its correspondingly coupled write word line.

10. A method comprising:

storing respective logic values in each of a first bit cell and a second bit cell;

selecting, using a multiplexer, one of a first input coupled to a first a first data line associated with the first bit cell and a second input coupled to a second data line associated with the second bit cell; and providing, from an output of the multiplexer to a gate terminal of a first PMOS (p-channel metal oxide semiconductor) transistor, wherein the first PMOS transistor is configured to pull a local read bit line to a logic high value responsive to a selected one of the first and second bit cells conveying a logic low value to its respectively coupled input of the multiplexer.

11. The method as recited in claim 10, further comprising:

activating a first NMOS (n-channel metal oxide semiconductor) transistor coupled between the first data line and the output of the multiplexer responsive to a gate terminal of the first NMOS transistor receiving a first selection signal via a first read word line; and activating a second NMOS transistor coupled between the second data line and the output of the multiplexer responsive to a gate terminal of the second NMOS transistor receiving a second selection signal via a second read word line.

12. The method as recited in claim 10, further comprising pulling the output of the multiplexer high via a pull-up stack comprising second and third PMOS transistors coupled in series between the output of the multiplexer and a voltage source responsive to de-assertion of respective signals on each of a first read word line associated with the first bit cell and wo a second read word line associated with the second bit cell.

13. The method as recited in claim 10, further comprising precharging the local read bit line, during a precharge cycle, using a precharge transistor coupled to the local read bit line, wherein during the precharge cycle, the precharge transistor is configured to pull the local read bit line to a logic low level.

14. A register file comprising:

a plurality of bit cells;

a multiplexer having a plurality of inputs, wherein each of the plurality of inputs is coupled to a data line of a corresponding one of the plurality of bit cells; and a first PMOS (p-channel metal oxide semiconductor) transistor having a gate terminal coupled to an output of the multiplexer, and further coupled between a local read bit line and a voltage source, wherein the first PMOS transistor is configured to pull the local read bit line to a logic high value responsive to a selected one of the plurality of bit cells conveying a logic low value to its respectively coupled input of the multiplexer.

15. The register file as recited in claim 14, wherein the multiplexer includes a plurality of NMOS (n-channel metal oxide semiconductor) transistors each coupled between the output of the multiplexer and a data line of a corresponding one of the plurality of bit cells, wherein respective gate terminals of each of the plurality of NMOS transistors is coupled to receive a corresponding select signal via a correspondingly coupled one of a plurality of read word lines, wherein each of the plurality of read lines is associated with a corresponding one of the plurality of bit cells.

16. The register file as recited in claim 14, further comprising a pull-up stack comprising second and third PMOS transistors coupled in series between the output of the multiplexer and the voltage source, wherein a gate terminal of the second PMOS transistor is coupled to a first read word line associated with a first one of the plurality of bit cells, and wherein a gate terminal of the third PMOS transistor is coupled to a second read word line associated with a second one of the plurality of bit cells.

17. The register file as recited in claim 14, further comprising a precharge transistor coupled to the local read bit line, wherein, during a precharge cycle, the precharge transistor is configured to pull the local read bit line to a logic low value.

18. The register file as recited in claim 14, wherein each of the plurality of bit cells include a corresponding storage node and a corresponding complementary storage node, wherein the complementary storage node of each of the plurality of bit cells is coupled to the data line associated with that bit cell.

19. The register file as recited in claim 18, wherein each of the plurality of bit cells comprise corresponding first and second pass transistors, wherein the first pass transistor of each of the plurality of bit cells is coupled between its corresponding storage node and a first write bit line, and wherein a second pass transistor of each of the plurality of bit cells is coupled between its corresponding complementary storage node and a second write bit line.

20. The register file as recited in claim 19, wherein each of the first and second pass transistors of each of the plurality of bit cells include respective gate terminals coupled to a corresponding write word line, wherein the first and second pass transistors of each of the plurality of bit cells is configured to be activated responsive to assertion of a write signal on its correspondingly coupled write word line.

* * * * *